United States Patent [19]

Voegeli

[11] 3,982,234

[45] Sept. 21, 1976

[54] HARD-MAGNETIC FILM OVERLAY APPARATUS AND METHOD FOR MAGNETIC MOBILE DOMAIN CONTROL

[75] Inventor: Otto Voegeli, San Jose, Calif.

[73] Assignee: International Business Machines Corporation, Armonk, N.Y.

[22] Filed: July 1, 1974

[21] Appl. No.: 484,476

[52] U.S. Cl. .................... 340/174 TF; 340/174 EB; 340/174 ZB
[51] Int. Cl.² .......................................... G11C 11/14
[58] Field of Search .............................. 340/174 TF

[56] References Cited
UNITED STATES PATENTS

| | | | |
|---|---|---|---|
| 3,778,788 | 12/1973 | Bobeck et al. | 340/174 TF |
| 3,836,898 | 9/1974 | Bobeck et al. | 340/174 TF |
| 3,887,905 | 6/1975 | Bobeck et al. | 340/174 TF |
| 3,944,842 | 3/1976 | Dorleijn et al. | 340/174 TF |

OTHER PUBLICATIONS
Applied Physics Letters — vol. 23; No. 8; Oct. 15, 1973 pp. 485–487.

American Institute of Physics — AIP Conference Proceedings No. 5, part 1; Nov. 16–19, 1971 pp. 130–134.

Primary Examiner—James W. Moffitt
Attorney, Agent, or Firm—Joseph E. Kieninger

[57] ABSTRACT

Stationary patterns of magnetic domains in a film layer of magnetically hard material define local field gradients for movement control of single-wall domains located in a contiguous sheet of magnetic "bubble" material. Suitable patterns of uniformly magnetized regions are established in the hard-magnetic film to provide the control pattern. A second garnet film of suitable composition, for instance, may be grown epitaxially on the bubble medium to provide the hard magnetic control film. Bubble domain confinement and propagation patterns are established in the hard-magnetic film by conventional recording methods or the desired pattern can be generated by projection or scanning the pattern with a light beam or an electron beam, or by thermomagnetic transfer from a master pattern.

25 Claims, 7 Drawing Figures

HARD-MAGNETIC FILM OVERLAY APPARATUS AND METHOD FOR MAGNETIC MOBILE DOMAIN CONTROL

BACKGROUND OF THE INVENTION

This invention relates generally to information storage devices and more particularly to thin film magnetic domain devices.

Field of the Invention

A single-wall or bubble domain for the present invention is defined as a magnetic domain bounded by a domain wall which closes on itself in the plane of a host magnetic medium and has a geometry independent of the boundary of its medium in the plane in which it is moved. The domain generally assumes the shape of a cylinder in the plane of a sheet of the medium and has a stable diameter determined by the parameters of the material comprising its medium. The term bubble domain includes circular wall shaped domains, elongated circular or stripe domains, and segment domains where a portion of the domain boundary is completed by a magnetic discontinuity such as a boundary of the domain medium. The use of the term bubble domains in the present discussion is meant to include all types of mobile domains whether closed wall domains or domains terminating at the edge or discontinuity of the medium.

The movement of bubble domains is normally obtained by externally generating within its medium, localized fields of a polarity to attract domains. Materials which are well known in the art for their ability to support bubble domains are rare earth orthoferrites and garnets. These materials have preferred directions of magnetization substantially normal to the plane of the sheet. Other single crystal magnetic materials may be used as single-wall domain carriers so long as the magnetic material is anisotropic along the axis normal to the plane of the sheet.

The movement of domains is accomplished generally by generating consecutive offset field gradients of a polarity to attract the domains. A domain then follows the consecutive attracting fields or propagation pattern from input to output positions in the sheet.

Description of the Prior Art

The prior art teaches methods of manipulating bubble domains in a first layer by the use of a time-varying magnetic configuration in a superposed second layer. In the prior art, the propagation and control of the single-wall bubble domains is accomplished by overlaying films of a high permeability material on the surface of a sheet of material in which the bubble domains are moved. The implementation of a structural pattern overlay of magnetically soft material required etching or masking to form a geometry to generate moving magnetic pole patterns when an in-plane field is rotated in the sheet of material in which the bubble domains are moved. The bubble domains follow the changing pole patterns from input to associated output position. Some examples of patents including different types of geometry for movement control of bubble domains are U.S. Pat. Nos. 3,540,019, 3,540,021, 3,523,286, and 3,653,010. The high permeability material is generally described as being permalloy.

The overlay may be of different coercivities, as evidenced by U.S. Pat. No. 3,541,535. Sets of consecutive overlay rectangles are aligned in parallel sets of three with each set comprising a low, medium, and high coercivity rectangle. A bubble domain is moved by magnetic pole patterns generated in the overlays in response to an inplane field increasing in magnitude along a first direction parallel to the long direction of the rectangle.

The overlay may also be another bubble domain material as discussed in U.S. Pat. No. 3,676,872. Separate, larger bubble domains are formed in the second layer, with one large bubble domain moving several smaller bubble domains in the first layer. Separate propagation means are contemplated to move the large bubble domains and thus move the smaller bubble domains.

The field for moving the single-wall domain may also be generated typically by series-connected conductor loop sets. The sets are pulsed in sequence to generate repetitive field patterns for moving information representative bubble domains. Individual conductors can be pulsed also in a programmed manner to effect logic operations between selected bubble domains. The effectiveness of the conductors is limited by its current carrying capacity and, since the conductors must move micron sized bubbles, only low currents can be used.

Further, as discussed in U.S. Pat. No. 3,599,190, a hybrid arrangement may be used which is a compromise between the conductor loop propagation and the magnetically soft patterned overlay. This arrangement includes a patterned overlay of a magnetically hard material. The conductors are used to alter locally the state of magnetization of some part of the overlay pattern. The pieces of magnetically hard material change the field gradients of the propagation system according to their position relative to the magnetically soft pattern.

Thus in the prior art, the propagation and control of bubble domains is accomplished by forming physical patterns, either conductors or geometric patterns, as an overlay to the bubble domain medium. The patterns are either etched from a continuous or large pattern overlay, or are formed on the domain material by sputtering the pattern material, for instance, onto the masked bubble medium. In either case, the spatial relationship of the pattern is limited and after formation becomes either permanent or correctable only through complicated procedures.

It is therefore an object of the present invention to provide an enhanced magnetic domain arrangement.

Another object of the present invention is to provide an enhanced domain propagation arrangement in which the propagation pattern is formed in a continuous overlay to the single-wall domain material.

Yet another object is to provide a layer of material for controlling single-wall domains which employs a hard-magnetic film contiguous to the domain sheet.

Still another object is to provide a single-wall domain arrangement wherein suitable patterns for controlling single-wall domains can be established without etching or masking the device.

Another object of the present invention is to provide a bubble domain control arrangement using stationary magnetic domains.

Yet another object is to provide an enhanced method for establishing a single-wall domain control device.

Still another object is to provide an enhanced method for establishing a single-wall domain control device in which a continuous layer of hard-magnetic material is located contiguous to the domain material.

Yet another object is to provide an enhanced method for forming a single-wall domain device using a continuous control layer of hard-magnetic material placed contiguous to the single-wall domain medium in which control patterns are magnetically established in the hard-magnetic material.

SUMMARY OF THE INVENTION

The present invention employs an overlay of magnetically hard material to a medium supporting mobile single-wall domains for providing the desired field gradients for mobile domain control. Suitable stationary geometric magnetic pole patterns are formed in the overlay for the confinement and control of the mobile domains in the contiguous sheet. The hard-magnetic layer may be a garnet film epitaxially grown on the surface of the mobile domain medium, with or without a separation layer for severing or using, respectively, any exchange coupling between the layers. The invention provides a magnetic bubble domain device comprising a multilayer assembly having at least a host bubble domain magnetic layer and a magnetically hard material layer, with stationary magnetic pole patterns established in the hard-magnetic layer providing the control of the bubble domains in its host medium. Means are included for cooperating with at least one stationary magnetic pole pattern for propagating the bubble domains in a predetermined path.

In its broadest aspect, the present invention provides a method for controlling mobile single-wall domains by establishing stationary magnetic pole patterns in a magnetically hard material overlaying the host mobile domain medium. A layer of a medium supporting mobile or bubble domains is fabricated. A control film of a hard-magnetic material is formed on or placed contiguous to said bubble domain medium. Stationary magnetic domains are established in the control film in a patterned configuration to control the movement of said mobile domains.

The stationary pole patterns serve to define propagation paths for bubble domains in the mobile domain medium. Being stationary, these pole patterns can, by themselves not effect domain propagation, which must be induced by some additional extraneous propagation means. One example of such propagation means is time varying drivefields generated within a superposed conductor overlay. The functions of the stationary pole pattern are to channel the flow of bubble domains along certain desired propagation paths and to impose specific environmental conditions which control the size and equilibrium spacing between bubbles along the various propagation paths. The particular desired conditions along different propagation paths and the arrangement of the paths themselves depend on the intended device function.

The present invention thus overcomes problems in the prior art, which use the propagation means also to define propagation paths. Inherent problems with this prior art approach arise because all presently known propagation means utilize a plurality of physically discrete structural elements. In order to define propagation paths, the planar dimensions of these propagation elements must be comparable to the diameter of the bubble domains. It is however well known that discrete elements can only be fabricated with a limited resolution. These limitations in the fabrication process prevent the utilization of even smaller bubble domains and similarly limit the closeness of adjacent propagation paths. It is generally acknowledged that a reduction in both dimensions would be desirable, since it would also reduce the cost per bit of data storage.

The present invention solves this problem by using different means for domain control and for domain propagation, because it is realized that each of these means can then be optimized for its intended function. In particular, the present invention teaches an improved method for establishing control means. The improvements of the disclosed methods are as follows: First, the control means comprises a continuous film, which has no physical structure, superposed onto the storage medium. Use of such a continuous film does not induce undesirable non-uniform stresses into the storage medium and also provides a desirable flat surface for the deposition of additonal layers. Second, the control means, which utilize a suitable "written" stationary domain pattern, can be generated by methods with greatly improved resolution capabilities and with improved fabrication efficiency. Third, the control means can be easily generated with different stationary domain pattern configurations. This permits personalized device structures which are physically identical to accomplish different device functions. And Fourth, the control means through the use of exchange and magnetic stray fields in combination allows the imposition of suitably varying conditions along different propagation paths.

The present invention overcomes problems in the prior art in that the magnetic pole patterns can be precisely established, with the limitation being only the magnetic wall width of the pattern. The patterns can be easily established and personalized for each use. Further, any imperfect patterns in the hard-magnetic layer can be easily corrected by erasing the pattern and repeating the formation process.

It is therefore an additional object of the present invention to provide an enhanced method and apparatus for the control of single-wall domains and to provide a device that permits easy and personalized formation of bubble domain control means with easy erasure and regeneration in the event of imperfect formation.

The resolution of the stationary domain in the hard-magnetic layer is defined by the establishing means such as a magnetic recording head. The width of the stationary domains can be closely controlled by controlling the pole piece thickness of thin film recording heads. With the advent of sub-micron bubble domains, sub-micron resolution is required of the domain controlling the bubbles. The sub-micron bubble domains are especially useful in a lattice type array of bubble domains.

Confinement means for lattice arrays can be established with geometric patterns of permanent narrow-stripe domains in a hard-magnetic film. The propagation means can be established in a suitable magnetic configuration such as the well-known "rachet" configuration in the hard-magnetic layer together with an alternating drive field produced by a current conductor. The use of the magnetically formed patterns in the hard-magnetic material of the present invention provides high resolution confinement means and permits low resolution propagation means to allow for control of sub-micron bubble domains.

These and other objects of the invention will become apparent to those skilled in the art as the description proceeds.

BRIEF DESCRIPTION OF THE DRAWING

Further features and a more specific description of an illustrated embodiment of the invention are presented hereinafter with reference to the accompanying drawing, wherein.

DETAILED DESCRIPTION OF THE PREFERRED EMBODIMENT

In general, the embodiment of the present invention discloses a bubble or mobile domain system that is characterized by the absence of physically discrete cutouts or overlays for controlling propagation such as a T and I or wedge-shaped pattern. The control patterns according to the present invention are established in a hard-magnetic film placed adjacent to a sheet of material used as the medium for the single-wall bubble domains. Patterned, stationary domains are established in the hard-magnetic control film to control the movement of the bubble domain.

The preferred embodiment, although describing an arrangement for control of what is generally known as bubble (circular) domains, contemplates a means for controlling other mobile domains. The term "bubble" domain will be used in the following description for ease of explanation and should not be taken as limiting the present invention only to circular single-wall domains.

Figure 1:
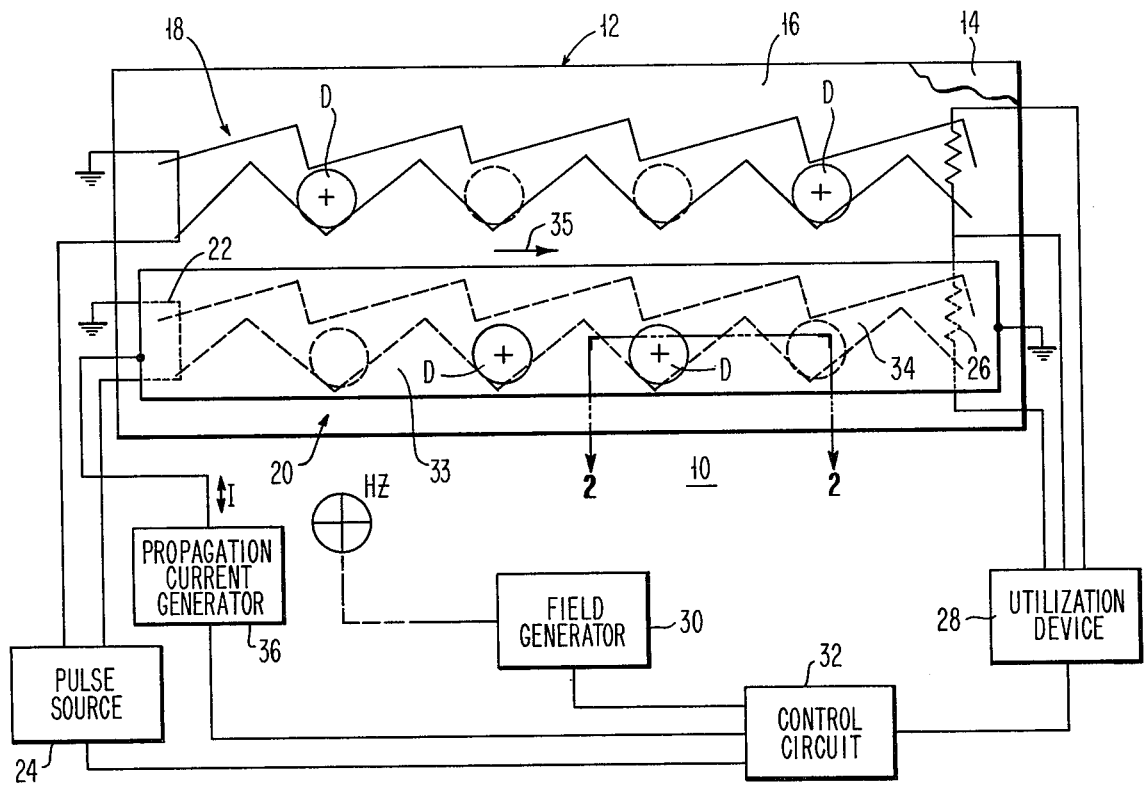
FIG. 1 is a schematic view of an information storage device in accordance with the present invention.

FIG. 1 shows an illustrative arrangement of an information storage device 10 comprising a laminate 12 including a host bubble domain layer 14 of, illustratively, garnet and a control film 16. The control film 16 of a hard-magnetic material essentially covers the host magnetic layer 14 or at minimum the areas required for control of domains. The hard-magnetic control film 16 is characterized by its high coercivity and high magnetic remanence so that a "permanent" pole pattern of stationary domains may be established within the layer by the application of an external magnetizing force. The film must retain its magnetic characteristics in the environment of the bubble domain arrangement including bias and propagation fields as well as magnetic stray fields from the bubble domains themselves.

Figure 3:
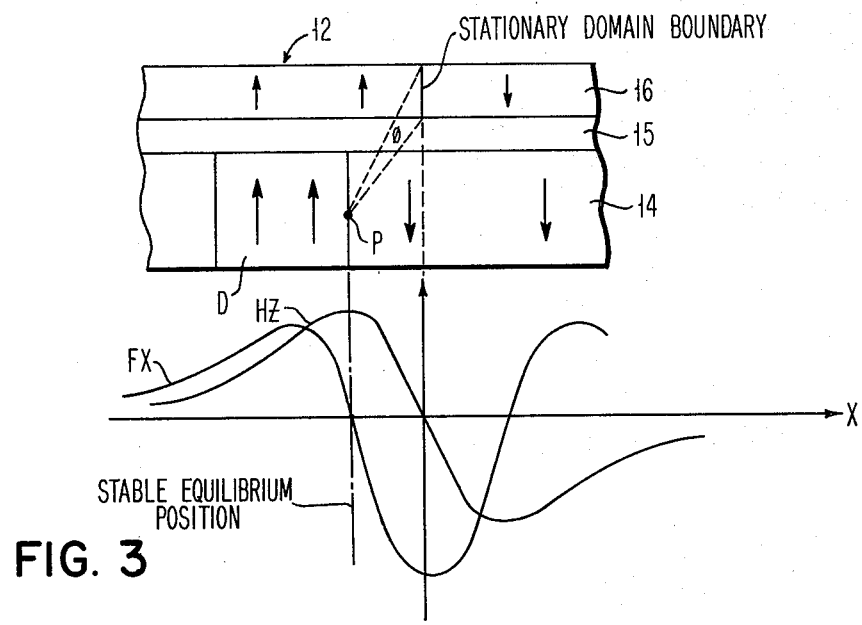
FIG. 3 is a cross-sectional view of a stationary domain boundary controlling a mobile domain with the laminate structure including an insulating spacer film, together with a graph of resultant forces.
Figure 4:
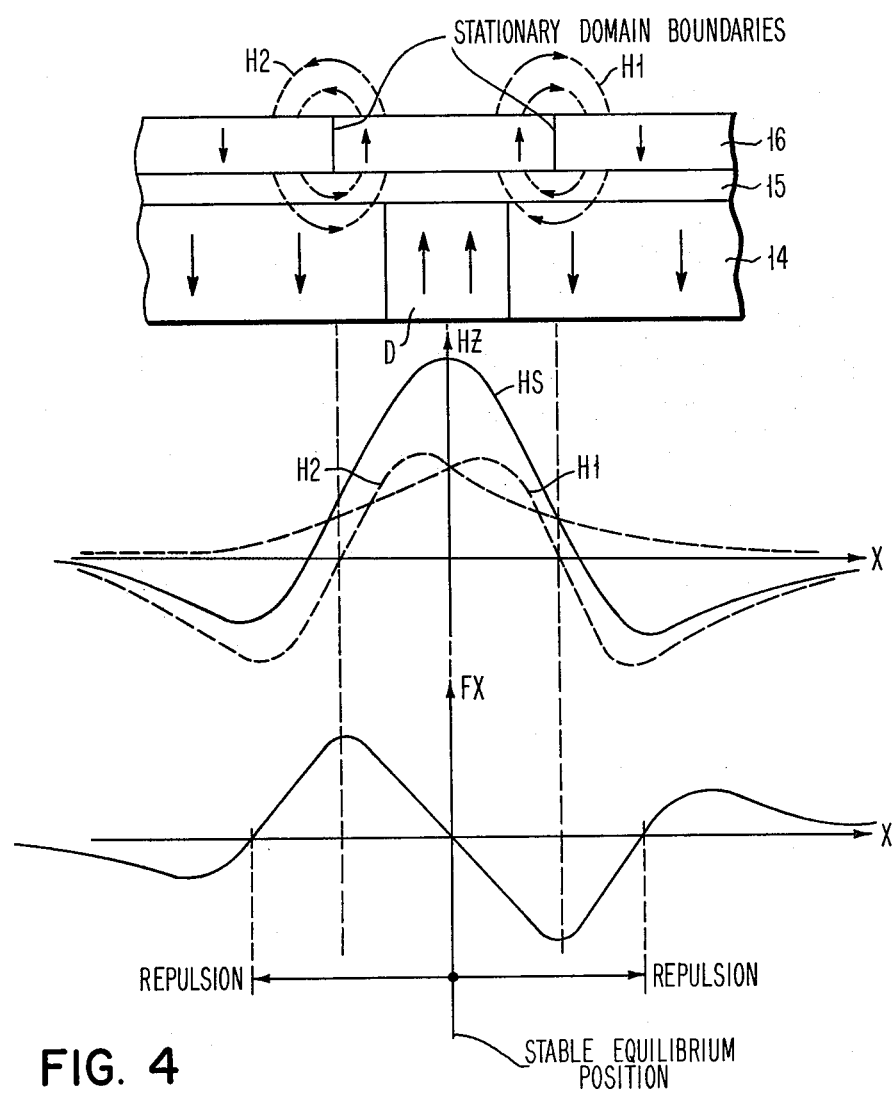
FIG. 4 is a cross-sectional view of two stationary domain boundaries including an insulating spacer film in the laminate structure, together with a graph of resultant forces.

In principle, suitable pole patterns can be produced by a magnetically hard material having its magnetization oriented in the plane as well as perpendicular to the plane of the film. In either case, magnetic stray fields arise whenever the magnetization reverses its polarity, or more accurately, wherever the divergence of the magnetization is non-zero. It should be noted that the desirable characteristics of the magnetically hard material are much alike those desired from a conventional recording medium. Any such medium may in fact be used as the control film 16. While in such a medium the magnetization is constrained to lie in the plane of the film, there are however advantages to having a medium with its easy axis of magnetization normal to the film plane in which the magnetic transitions intrinsically tend to occur along well defined straight lines. Methods for inducing such anisotropy characteristics with easy axis normal to the film plane are well known. In my preferred embodiment I use as the control film a material having the same crystal structure as the storage medium, so that the control film may be grown epitaxially onto the strong medium. Because the resulting control film is then "single crystal" its hysteresis loop is almost perfectly "square" and the retention of any imprinted domain pattern is assured. These desired coercive and anisotropic properties of the magnetically hard material depend on the film composition and the fabrication process. Methods for fabricating such films are well known. For example, spun films of gadolinium iron garnet $(Gd_3Fe_5O_{12})$, 0.5 $\mu$m thick have been used. These films were grown epitaxially on 4 $\mu$m thick garnet bubble storage medium with a composition such as $Eu_{0.7} Y_{2.3} Fe_{3.9} Ga_{1.1} O_{12}$. In cases where a thin separation layer was employed to eliminate exchange coupling between control and storage film, a non-magnetic gadolinium gallium garnet film $(Gd_3Ga_5O_{12})$, about 0.1 $\mu$m thick, was used. The entire laminate then has a monolithic crystalling structure. The control field obtained with and without a separation layer is shown in FIGS. 3, 4 and 5 and will be described later.

The information storage device 10 of FIG. 1 operates as a series of shift registers with two shown, 18 and 20, each including an input means, a propagation channel means and an output means. The input or write means to the propagation channels are defined by a conductor 22 connected between a pulse source 24 and ground. The output means of the shift register 20 is defined by a sensing means shown as a magnetoresistive sensor 26. The magnetoresistive sensor 26 is connected to a utilization device 28. A field generator 30 generates a bias field HZ to maintain a preferred diameter for the domains D in the host magnetic layer 14. The propagation channel means comprising a zig-zag or rachet pattern 34 established by a stationary magnetic domain formation in the hard-magnetic film 16 together with a propagation conductor 33 providing a reversing magnetic field via the current I generated by a propagation current generator 36. A control circuit 32 is connected to the pulse source 24, the field generator 30, the utilization device 28, and the propagation current generator 36 for selectively controlling each as needed to operate the information store. The various sources and circuits shown in FIG. 1 may be any such element capable of operating in accordance with this invention.

Only one propagation conductor 33 is shown in FIG. 1 for clarity of the description. It is evident that the conductor 33 is continuous over the rachet pattern 34 to provide the reversing magnetic field needed to propagate the bubble domains. Therefore a similar propagation conductor is provided for the shift register 18.

Information is stored in the shift registers of FIG. 1 with the presence of a bubble domain being a "1" and the absence of a bubble domain being a "0". The presence of a domain in FIG. 1 is shown by a group of circles designated D. The absence of a domain is indicated by a broken circle. The illustrative stored information then in the top shift register 18 is 1001 as viewed from left to right in FIG. 1, and as 0110 in the lower shift register circuit 20.

Consecutive bits are formed at the input or write position of the lower shift register 20, for instance, synchronously with the movement of information in the register and the sensing of the bubble domains in the magnetoresistive sensor 26. The storage of the presence and absence of a domain D at an input position depends on the presence and absence, respectively, of a pulse in the conductor 22. The presence of a pulse in the conductor 22 results in the nucleation of a domain D from the write means comprising the pulse source 24 and the conductor 22, into the input position for propagation by the propagation means.

Propagation by the use of the rachet patterns utilizes the fact that a bubble domain D will move in the direction of a magnetic field applied in the plane of the bubble medium by the propagation conductor 33. Propagation is achieved by moving the bubble domains into and out of a symmetrical energy trap. The energy traps are formed in the wedge-shaped rachet patterns. Since the bubble domains assume a position in the rachet pattern where the magnetostatic energy is minimized, bubble domains are more easily moved off the point of the wedge rather than into the blunt edge of the wedge. Consequently, the domains D can be propagated in the direction of the arrow 35 along the series of rachet patterns by controlling the direction of the current I through the propagation conductor 33. When the magnetic field generated by the conductor 33 moves the bubble domains D in an upward direction in the plane of FIG. 1, the bubble domains D will move in the channel of the rachet pattern up the lower wedge and over its point. The blunt top wedge prevents further upward motion of the bubble domain. When the current I through the conductor 33 is reversed, the bubble domains continue down the lower wedge until the position is attained by the bubble domain D as shown in FIG. 1. The bubble domain D will not return to the left of the figure because the wedge points provide a high energy path beyond that provided by the field generated by the conductor 33. A further discussion of the propagation of the bubble domain in a rachet pattern 34 and other rachet patterns usable with the present invention is given in an article "Localized Control of Magnetization in LPE Bubble Garnet Films " by R. C. Le Crain et al, published in the IEEE Transactions on Magnetic, Vol Mag-9, No. 3, September 1973 at pages 424–5.

Figure 2:
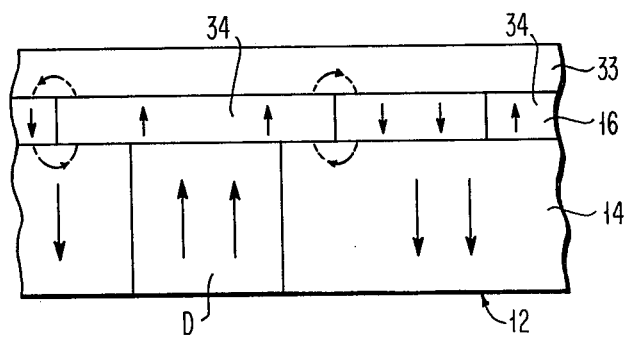
FIG. 2 is a cross-sectional view taken along lines 2—2 of FIG. 1.

The magnetic patterns of the domains D in the host magnetic material 14 and the ratchet pattern 34 capable of being used in the hard-magnetic film 16 are shown in FIG. 2. FIG. 2 shows a cross-sectional view across the propagation path of the shift register 20. Using the convention that the domains D are formed in an upward or positive magnetization, then the ratchet patterns 34 are also formed with a positive magnetization. This assumes that a material is used for the hard-magnetic film 16 in which the easy direction of magnetization is normal to the plane of the film. If an in-plane easy magnetization material is used for the hard-magnetic film 16, then the magnetization of the rachet patterns 34 would be formed into the plane of the figure. Conversely then, the magnetization of the surrounding area would be formed out of a plane of the figure.

It is evident that, since the bubble control means, the rachet patterns 34, are formed by "writing" the magnetic pattern into the hard-magnetic film and not by physical formations, the control patterns can be changed easily by merely realigning the magnetic domains in the film 16 and rewriting the pattern as required. Mistakes in the pattern can be thus easily corrected in the event of errors. Further the patterns can be easily personalized for any particular propagation or other control pattern as required. The patterns required in the film can be duplicated easily by the use of any of the well known magnetic duplication processes such as that used for duplicating the magnetic patterns of common recording tape. The ease and precision with which the confinement lines especially can be formed makes the use of a hard-magnetic film according to the present invention of great importance to a confined array of bubble domains.

The method of providing the control of magnetic single-wall bubble domains therefore comprises first forming a layer of the host magnetic material for the domains. The hard-magnetic material is then formed as a continuous film on the host material. The hard-magnetic material should be continuous over the area that the stationary domain patterns are to be magnetically generated. In one embodiment, the magnetic pattern for control of the bubble domains is established in the hard-magnetic material after the film is placed over the layer of the host material. This would be used if for instance the hard-magnetic layer is garnet epitaxially grown on the bubble medium.

In another embodiment, the hard-magnetic material is formed as a film layer and pattern magnetized separately from the host magnetic layer. The film layer is then laminated to the host layer. As desired, an additional propagating means could be formed over the hard-magnetic layer. This separate propagation apparatus could comprise the well known T and I bars or conductors.

The laminate and the established stationary domain patterns may comprise several different structures. In FIG. 3 the laminate 12 comprises the bubble medium 14, the control film 16 and a non-magnetic spacing film 15. The spacing film 15 breaks the exchange bias which affects the stray field generated by the domains in the control film 16. An example of the field control of the bubble domain in an exchange coupled laminate will be described later in FIGS. 5A and 5B.

Still referring to FIG. 3, the magnetic field effect of the stationary domain in the control film 16 on the bubble domain D is a function of the saturation magnetization of the control film 16 and the bubble medium 14, the diameter of the bubble domain D, and the distance X between the bubble domain and the control film domain boundary. The average stray field from the control film domain at point P of the bubble domain is determined by the formula:

$$HZ = 4 M_s' \Theta$$

where $M_s'$ is the saturation magnetization of the control film 16. Then the force FX on the bubble located at point P is determined by:

$$FX = \frac{\delta HZ}{\delta X} d \cdot M_s$$

where $d$ is the diameter of the bubble domain. A graph of the resultant field HZ and the force FX for distances X from the stationary domain is shown in FIG. 3. The stable equilibrium position is at the point where the force FX is equal to zero. The bubble domain D will not move away from or towards the stationary domain of the control film 16 because an external energy is required to overcome the increasing force FX.

FIG. 4 shows the effect of two stationary domain boundaries in the control film 16 on a bubble domain D. Similarly to FIG. 3, the laminate 12 comprises the bubble medium 14, the insulating spacing film 15 and the control film 16. The magnetic field $H_1$ and $H_2$ of the stationary domain boundaries both affect the bubble domain D.

The first graph in FIG. 4 shows the field effects $H_1$ and $H_2$ of the stationary domains. The field HS is the summation of the fields $H_1$ and $H_2$. The force FX on the bubble domain D is calculated as before. The stable equilibrium position is again where the force FX is equal to zero. This structure is representative of the rachet propagation pattern 34 of the information storage device 10 of FIG. 1. The rachet pattern 34 can be magnetized, therefore, in a manner as shown between the stationary domain boundaries of FIG. 4. The bubble domain D is guided by the stationary domains.

Figure 6:
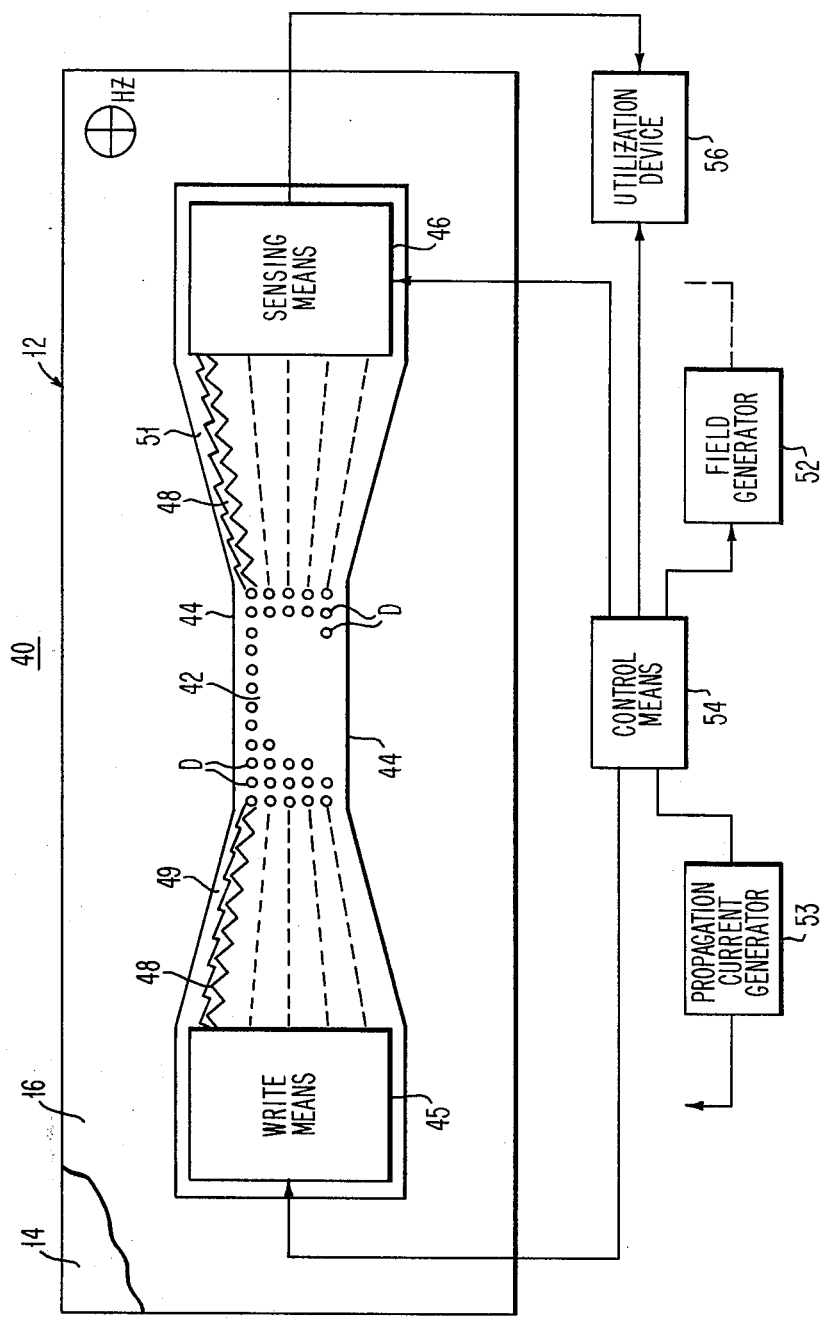
FIG. 6 is a schematic representation of an information storage device using a lattice array domain storage with the present invention.

In certain applications of bubble domains such as the lattice array storage systems, an example of which is shown in FIG. 6, it is necessary to apply different values of bias field to different device areas, depending on whether isolated or interactive bubble domains need to be stable within a given area. Present designs use current conductors and/or local thickness variations in the bubble medium to achieve this effect. The present invention offers an improved scheme where said variations in bias field are produced by a suitable stationary domain configuration in the control film. For if the control film is in direct contact with the bubble medium than it can exert exchange bias on the bubble medium. The amount of bias depends on the exchange interaction between the storage and control film and thus on the specific materials used. The sign, whether positive or negative, of the exchange bias depends on the orientation of the magnetization in the control film. In our preferred embodiment the control film has the easy axis of magnetization normal to the film plane and the magnetization within any given domain is either up or down. Consequently, the exchange bias resulting from such a stationary domain has a fixed magnitude but may be either positive or negative depending on the direction of the domain magnetization.

In an embodiment having the control and storage film in direct contact with each other, both types of interaction, exchange and magnetostatic, are generally present and are utilized. The two interactions differ in effect in that exchange exerts a uniform bias within each control domain, whereas magnetostatic interactions occur about the domain boundaries only. While magnetostatic interactions are strictly proportional to $M_s'$, the saturation magnetization of the control film, the strength as well as the relative sign of the exchange bias depends on the materials used, as is exemplified in FIG. 5A.

Figure 5A:
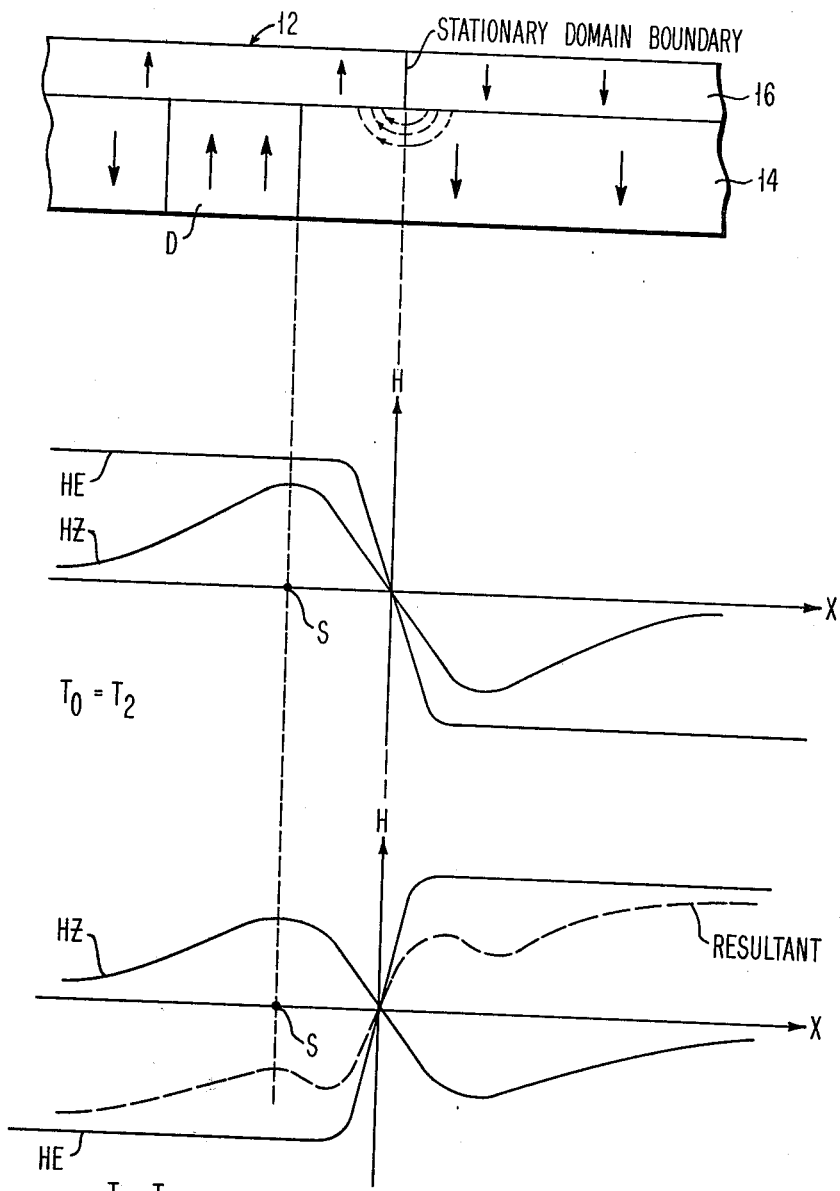
FIG. 5A is a cross-sectional view of an exchange coupled laminate having a stationary boundary controlling mobile domains, together with a graph of resultant forces.

FIG. 5A shows the field effect of a laminate 12 where there is an exchange bias between the bubble domain medium 14 and the control film 16. The control film 16 is in contact with the bubble medium. The field effect of the domain in the control film 16 is the result of the stray field HZ as before and an exchange bias field HE. The magnetization of the bubble medium ($M_s$) and the control film ($M_s'$) depends upon the operating temperature. Different materials have different operating curves.

Figure 5B:
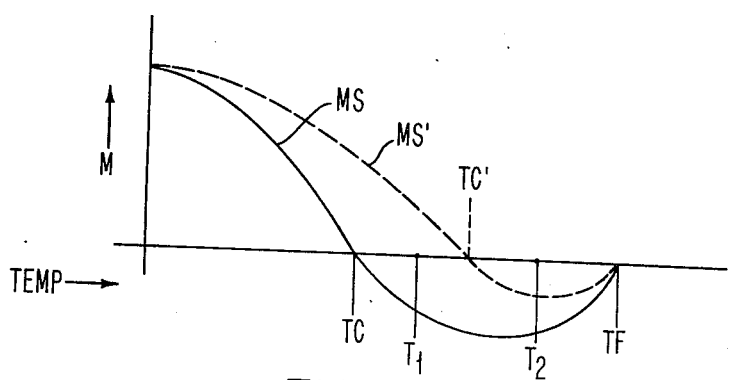
FIG. 5B is a graph of the temperature effect on laminate materials of FIG. 5A.

In FIG. 5B is shown a graph of the magnetization for a laminate 12 comprising a gadolinium iron garnet ($Gd_3Fe_5O_{12}$) material used for the control film 16. The magnetization versus temperature curves for the control film and the bubble medium is different. The control film 16 has a magnetization $M_s'$ as shown by a dashed line and a compensation temperature $T_c'$. The bubble medium 14 has a magnetization $M_s$ and a compensation temperature $T_c$. Both materials have a similar Curie temperature $T_f$.

Two graphs are shown in FIG. 5A, the first for an operating temperature $T_0$ equal to the temperature $T_2$ on the graph of FIG. 5B and the second for an operating temperature $T_0$ equal to the temperature $T_1$. With the operating temperature $T_2$, the exchange bias HE subtracts from the dc bias field and the stable equilibrium position S is as shown. With the operating temperature of $T_1$, the exchange bias adds to the dc bias field and a channel is provided in which bubble domains are stable.

Depicted in FIG. 5A is an embodiment where both control as well as storage film are a rare earth iron garnet with the easy axis of magnetization normal to the film plane. It is assumed that the control film material exhibits a compensation temperature $T_c'$ where there occurs a sign reversal of the magnetization $M_s'$, as is the case in gadolinium iron garnet for instance, see FIG. 5B. Because the $M_s'$ dependent magnetostatic interactions change sign at the compensation temperature $T_c'$, whereas the sign of the exchange bias remains unchanged, the effect of the control film is different above and below the temperature $T_c'$. FIG. 5A shows the effects of exchange and stray field bias at temperatures above and below $T_c'$, where the operating temperature $T_0$ is shown equal to $T_2$ and $T_1$ in the first and second graphs, respectively.

The condition where the operating temperture $T_0$ is equal to $T_1$ is of particular interest because it provides at point S a stable domain position, an accessing channel, with an exchange bias as to render isolated bubble domains stable. Such conditions are necessary along bubble lattice array accessing channels where during the read/write process isolated bubble domains have to be manipulated. It should be noted that the condition when the operating temperature $T_0$ is equal to $T_1$ can be established at any desired temperature by selecting an appropriate value for the temperature $T_c'$ through a suitable choice of garnet composition.

In FIG. 6, an information store 40 is shown comprising a confined lattice array 42 of magnetic bubble domains D formed in the laminate 12 comprising the host magnetic layer 14 and the hard-magnetic film 16 as previously described. In a confined array of interactive elements such as the lattice array 42 of single-wall magnetic domains D, the domains D are held within the bonds of one lattice array to form one information storage device. High packing density of the domains is obtained. The lattice array 42 should include a confinement means shown as outer confinement lines or stripes 44 to hold the domains D within the bounds of its lattice array. A complete description of a system using lattice arrays of magnetic domain devices is given in U.S. patent application Ser. No. 395,336, filed on Sept. 7, 1973 and now abandoned, entitled "System Using Lattice Arrays of Interactive Elements," and assigned to the same assignee as the present invention. With the increased packing densities and sub-micron bubble diameters used with the lattice array, systems chip packing and domain control required precision resolution of the confinement lines 44. Further, since the confinement lines according to the present invention do not require an external current flow, the stability of the array without external power is assured.

FIG. 6 shows an information storage device 40 for moving single-wall domains D from a write means 45 into the lattice array 42 and out of the lattice to a sensing means 46. Geometric fan-in and fan-out are provided in which domains D move from the write means 45 into the lattice array 42 and then to the sensing means 46. The domains D move from the write means 45 using rachet-shaped propagation structures or patterns 48 including suitable conductor lines (not shown) similar to that shown in FIG. 1. The domains D as created by the write means 45 are separated by a distance of four diameters of the domains. The domains in the lattice array 42 are separated by a distance of two diameters. The structure for achieving this compacting of the domains is conveniently a plurality of the rachet-shaped patterns 48 forming a plurality of trains of domains from the write means 45 to the lattice array 42. The train of patterns 48 with suitable conductors (not shown) form a first and second propagation means 49 and 51, respectively, to transmit the bubble domains from the write means 45 to the lattice array 42 and from the lattice array to the sensing means 46. Only one complete propagation path is shown, it being evident that each can be of a similar structure.

The outer confinement lines 44 are formed around the write means 45, across the first propagation means 49, the lattice array 42, and the second propagation means 51, and around the sensing means 46. The outer confinement stripes 44 along with the inate interactive forces between domains provides the spacing between the domains while within the lattice array. The formation of the outer confinement lines 44 according to the present invention by aligning the stationary magnetic domains in the hard-magnetic layer 16 provides for a complete confinement of the domains and permits the potentially close packing of several separate storage devices on one garnet chip. One conductor line can never form a perfect enclosure since the current paths must be separated. A separate conductor must thus be insulated from the first conductor and cross its input legs to prevent leakage of bubble domains. With the present invention, a complete enclosure can be magnetically formed without the possibility of loss of domains.

The propagation of the domains D into and out of the lattice array 42 is similar to that described for FIG. 1. The domains D are propagated along the propagation rachet patterns 48 by conductor lines (not shown) controlled by a propagation current generator 53. A bias field HZ is provided by a field generator 52 normal to the bubble domain medium for stabilization of the bubble domains if required. A control means 54 synchronizes the field generator 52 with the write means 45, the sensing means 46 and the propagation current generator 53. The sensing means 46 sense the domains propagated from the lattice array 42 through the second propagating means and directs the sensed output to a utilization device 56. The various means and devices shown in FIG. 6 are all well known in the art and it is obvious that various types could be used to provide the necessary functions for this embodiment of the invention.

It should also be evident that there could be applications that require additional elements such as high permeability propagation patterns and additional current conductors. These additional elements could easily be formed in the usual manner on top of the hard-magnetic film. Since the hard-magnetic film needs to be only a fraction of a micron thick, it should not interfere with the operation of any superposed element. For instance, in FIG. 6, the outside confinement stripes 44 could be formed into the hard-magnetic film 16 by magnetic forces such as a recording head as previously described. Current conductors could be formed to propagate the domains from the write means 45 into the lattice array 42 as described in the aforementioned application Ser. No. 395,336.

The control stationary domains and the laminate used in the information storage devices of FIGS. 1 and 6 could comprise any of the types shown or made obvious by the examples in FIGS. 3–5. For instance, the rachet propagation pattern 48 of FIG. 6 could be as shown in FIG. 4. The confinement lines could be similarly formed or could be established as shown in FIG. 3. The non-magnetic film 15 would be required. Further, portions of the laminate could comprise an exchange coupled section as shown in FIG. 5 with a section including the insulating film 15.

The present invention thus contemplates the use of a hard-magnetic control film instead of physically discrete patterns on top of the host domain material. Suitable patterns of uniformly magnetized regions are positioned into the hard-magnetic film. Field gradients are therefore formed about the domain boundaries of the patterns which can then be used to control single-wall bubble domains. More precise control of the field gradients occurs since the resolution of the magnetic domains placed in the hard-magnetic film is limited only by the required thickness of the Bloch wall formed in the hard-magnetic film. Personalized control patterns can be easily established. The fabrication of the control patterns is greatly simplified since imperfect patterns can be easily erased and regenerated.

Using a 0.7 $\mu$m thick spun GdIG film as the hard magnetic control film on a garnet magnetic bubble domain layer, patterns with a line width of 1 $\mu$m can be written into the hard-magnetic overlay by means of a conventional thin film recording head. In three layer laminates, the garnet bubble medium can illustratively be 3 $\mu$m thick, with a control film of 0.6 $\mu$m thickness and an insulating spacing layer of 0.1 $\mu$m thickness. Patterns having a line width of 1 $\mu$m can be established in the control film by the conventional recording head.

The principles of the invention have now been made clear in an illustrative embodiment. It will be immediately obvious to those skilled in the art many modifications of structure, arrangement, proportion, the elements, materials and components used in the practice of the invention. For instance, hard-magnetic garnet film has been discussed for the high magnetic remanence required of the hard-magnetic film in the present invention. It is obvious that other hard-magnetic films having a high coercivity and high magnetic remanence could be used such as the well known magnetic recording media. Further, other propagation patterns could be used such as the well known "angelfish" wedge patterns. These materials could be used without departing from within the scope of this invention. Also other means for moving the bubble domains within the stationary domain control pattern could be used such as dual conductor lines, each provided an attractive and repulsive magnetic force on the bubble domain as required. The appended claims are therefore intended to cover and embrace any such modification, within the limits only of the true spirit and scope of the invention.

What is claimed is:

1. A single-wall magnetic domain arrangement comprising:
   a first layer of materials in which mobile magnetic domains can be moved;
   a second layer of magnetically hard material placed contiguous to a surface of said first layer; and
   stationary magnetic domains in said second layer arranged in a permanent arbitrarily selected control configuration to provide a predetermined path substantially independent of the bias field for the movement of the mobile domains in said first layer.

2. An arrangement in accordance with claim 1 wherein said second layer comprises a garnet material.

3. An arrangement as defined in claim 1 wherein said second layer comprises a material having a preferred direction of magnetization normal to the plane of the layer.

4. An arrangement as defined in claim 1 wherein said second layer is a continuous film covering essentially one surface of said first layer.

5. An arrangement as defined in claim 1 wherein said stationary magnetic domain control configuration establishes a rachet-shaped propagation channel.

6. An arrangement as defined in claim 1 further including an insulating spacing layer placed between said first and second layers for preventing an exchange bias coupling between said first and second layers.

7. A single-wall domain arrangement comprising:
   a layer of material in which single-wall mobile magnetic domains can be moved;
   a film of magnetically hard material placed contiguous to a surface of said layer;
   a stationary magnetic domain pattern established in said film defining a propagation control channel for the movement of mobile domains in said layer; and
   propagation means for generating a repetitive magnetic field for moving the mobile domains under control of said channel.

8. An arrangement as defined in claim 7 wherein said film comprises a material having a preferred direction of magnetization normal to the plane of the layer.

9. An arrangement as defined in claim 7 wherein said stationary magnetic domain pattern defines a rachet-shaped propagation control channel and said propagation means is a current conductor and a current generator.

10. An arrangement as defined in claim 7 wherein said film is a continuous film covering essentially one surface of said layer of material.

11. An arrangement as defined in claim 7 further including an insulating spacing film placed between said layer and said magnetically hard film for preventing an exchange bias coupling between them.

12. An arrangement as defined in claim 7 wherein said pattern includes confinement lines providing lateral confinement to said mobile domains in said layer.

13. A single-wall domain arrangement comprising:
    a sheet of magnetic material in which single-wall mobile magnetic domains can be propagated;
    a film of magnetically hard material placed contiguous to a surface of said sheet;
    a lattice array of single-wall mobile magnetic domains formed in said sheet;
    a confinement configuration established by stationary magnetic domains in said film and surrounding said lattice array, the positions of said mobile domains in said lattice array being substantially determined by said confinement configuration and interaction between said mobile domains.

14. An arrangement as defined in claim 13 further including a propagation control configuration established by stationary magnetic domains in said film for controlling the movement of mobile domains into and out of said lattice array.

15. An arrangement as defined in claim 13 wherein said film comprises a material having a preferred direction of magnetization normal to the plane of the film.

16. An arrangement as defined in claim 13 wherein said film is a continuous film covering essentially one surface of said layer of material.

17. An arrangement as defined in claim 13 further including an insulating spacing film placed between said sheet and said magnetically hard film for preventing an exchange bias coupling between them.

18. An arrangement as defined in claim 14 further including a propagation means for generating a repetitive magnetic field for moving the mobile domains under control of said propagation control configuration.

19. A method of providing a single-wall magnetic domain arrangement comprising the steps of:
    fabricating a layer of a host material capable of supporting mobile magnetic domains;
    fabricating a control film of a hard-magnetic material;
    placing said fabricated control film contiguous to said fabricated layer of host material; and
    establishing a permanent arbitrarily selected stationary patterned magnetic domain configuration in said control film to provide a predetermined path substantially independent of the bias field for the movement of the mobile domains in said layer of host material.

20. A method as described in claim 19 further including steps of fabricating a spacing film of a non-magnetic material and placing said spacing film contiguous to said fabricated layer of host material, with said fabricated control film being placed contiguous to said spacing film.

21. A method of providing an arrangement for control of mobile magnetic domains in a medium supporting the mobile magnetic domains comprising the steps of:
    fabricating a control film of a hard-magnetic material on said mobile domain support medium; and
    establishing a permanent arbitrarily selected stationary patterned magnetic domain configuration in said control film to provide a predetermined path substantially independent of the bias field for the movement of the mobile domains in said support medium.

22. A method of providing a single-wall magnetic domain arrangement comprising the steps of:
fabricating a layer of a host material capable of propagating single wall mobile domains;
providing at least one mobile domain in said host layer;
forming a control film of hard-magnetic material on said host layer; and applying an external magnetic field to said formed control film in a manner to establish a permanent arbitrarily selected patterned stationary magnetic domain configuration in said film to provide a predetermined path substantially independent of the bias field for the movement of said mobile domains.

23. A method as described in claim 22 further including a step of forming a non-magnetic spacing film on said fabricated layer with said control film being formed on said formed insulating spacing film.

24. A method of providing an arrangement for control of mobile single-wall magnetic domains in a medium supporting the mobile domains comprising the steps of:
fabricating a spacing film of an insulating material on said mobile domain support medium;
fabricating a control film of a hard-magnetic material on said spacing film; and
establishing a permanent arbitrarily selected stationary patterned magnetic domain configuration in said control film to provide a predetermined path substantially independent of the bias field for the movement of the mobile domains in the support medium.

25. A method of providing a single-wall magnetic domain arrangement comprising the steps of:
fabricating a continuous first sheet of a host material capable of propagating single-wall magnetic domains;
fabricating a continuous second sheet of hard-magnetic material;
applying an external magnetic field to said second sheet in a manner to provide a permanent arbitrarily selected patterned stationary magnetic domain configuration in said second sheet for controlling the propagation of the single wall domains substantially independent of said field;
laminating said first and second sheets together; and
providing at least one single wall domain in said host material.

* * * * *